United States Patent [19]

Porter et al.

[11] Patent Number: 5,028,988
[45] Date of Patent: Jul. 2, 1991

[54] METHOD AND APPARATUS FOR LOW TEMPERATURE INTEGRATED CIRCUIT CHIP TESTING AND OPERATION

[75] Inventors: Warren W. Porter, Escondido; Donald K. Lauffer, San Diego, both of Calif.

[73] Assignee: NCR Corporation, Dayton, Ohio

[21] Appl. No.: 457,641

[22] Filed: Dec. 27, 1989

[51] Int. Cl.$^5$ ................... H01L 23/02; H01L 25/04
[52] U.S. Cl. ........................... 357/81; 357/82; 357/83; 357/87; 361/382; 165/80.4; 324/158 T; 324/158 D
[58] Field of Search ............... 357/81, 82, 83, 87; 324/158 T, 158 F, 158 D, 158 P; 361/381, 382; 165/80.2, 80.4, 104.33

[56] References Cited

U.S. PATENT DOCUMENTS

| | | | |
|---|---|---|---|
| 2,758,146 | 8/1956 | Lindenblad | 357/82 |
| 2,872,788 | 2/1959 | Lindenblad | 62/3 |
| 2,994,203 | 8/1961 | Lackey et al. | 62/3 |
| 3,400,543 | 9/1968 | Ross | 357/82 |
| 3,406,753 | 10/1968 | Habdas | 165/185 |
| 3,441,812 | 4/1969 | DeBucs et al. | 357/82 |
| 3,481,393 | 12/1969 | Chu | 357/82 |
| 3,602,721 | 8/1971 | Nakamura et al. | 357/82 |
| 3,648,167 | 3/1972 | Purdy et al. | 324/158 |
| 3,979,671 | 9/1976 | Meeker et al. | 324/158 F |
| 4,253,515 | 3/1981 | Swiatosz | 165/61 |
| 4,279,292 | 7/1981 | Swiatosz | 165/61 |
| 4,607,220 | 8/1986 | Hollman | 324/158 F |
| 4,628,991 | 12/1986 | Hsiao et al. | 165/80 |
| 4,704,872 | 11/1987 | Jones | 62/3 |
| 4,741,385 | 5/1988 | Bergles et al. | 165/1 |
| 4,744,220 | 5/1988 | Kerner et al. | 62/3 |
| 4,748,495 | 5/1988 | Kucharek | 357/82 |
| 4,812,733 | 3/1989 | Tobey | 323/285 |
| 4,862,075 | 8/1989 | Choi et al. | 324/158 F |

OTHER PUBLICATIONS

Skobern, 'Thermoelectrically cooled module', IBM Tech. Dis. Bull.; vol. 27 No. 1A Jun. 1984 p. 30.
Rideout, 'Close-cycle liquid nitrogen refrigeration system . . .' IBM Tech. Dis. Bull.; vol. 18 No. 4 Sep. 1975; pp. 1226-1229.

Primary Examiner—Rolf Hille
Assistant Examiner—David Ostrowski
Attorney, Agent, or Firm—Wilbert Hawk, Jr.; Stephen F. Jewett; Gregory P. Gadson

[57] ABSTRACT

Methods and apparatus for lowering integrated circuit (IC) chip ambient temperatures allow a slow IC chip to simulate a faster, functionally equivalent one for design testing purposes when the faster chip is not yet available. The cooling devices employed include a cryogenic chip cooling apparatus, and a novel thermo-electric chip cooling apparatus using a directly water-cooled Peltier effect device attached to the surface of the IC chip.

31 Claims, 5 Drawing Sheets

METHOD AND APPARATUS FOR LOW TEMPERATURE INTEGRATED CIRCUIT CHIP TESTING AND OPERATION

FIELD OF THE INVENTION

The present invention generally relates to integrated circuit (IC) chip testing, and IC chip operating speeds. More specifically, the present invention relates to a method and apparatus for simulating the operation of a yet to be built IC chip by an available IC. Additionally, the present invention relates to specific methods and apparatuses for increasing IC chip operating speeds.

BACKGROUND OF THE INVENTION

A problem exists in the prior art where an IC chip expected to operate at high speeds is designed, but does not have a physical embodiment. In this case, it is not known whether the IC chip will properly function. Software simulation is not a solution, since it does not predict whether a given IC chip will operate at a certain speed. One solution is to use an existing, functionally equivalent slower IC chip to simulate the operation of the not-yet built faster IC chip. However, the slower IC chip may be a poor predictor of system performance at the higher speed. What is desired, but non-existent in the prior art, is a method and apparatus that uses an actual IC chip for simulating a designed, but yet unavailable IC chip at the expected operating speed.

It is known that, with respect to CMOS technology, lower temperatures cause an IC chip to operate at a higher frequency because of increased carrier mobility. The present invention recognizes this fact in developing a solution to the problem.

In a related problem in the prior art, thermo-electric cooling methods for cooling IC chips have been used without significant success because heat transfer away from the thermo-electric cooling module has been inadequate, and because of undesirable thermal resistances and corrosion.

SUMMARY OF THE INVENTION

To that end, it is an object of the present invention to provide a method and apparatus for simulating an IC chip when that chip is unavailable by using a functionally equivalent, although slower IC chip, which has its normal operating speed increased.

It is also an object of the present invention to increase the operating speed of the slower IC chip by lowering the temperature of the slower chip.

It is an additional object of the present invention to lower the temperature of the slower chip by using a cryogenic cooling apparatus.

A further object of the present invention is to lower the temperature of the slower chip by using a thermo-electric cooling apparatus.

It is yet a further object of the present invention to provide a thermo-electric cooling apparatus in which, unlike prior art apparatuses, heat is removed from a thermo-electric module at a sufficient rate.

Still a further object of the present invention is to provide a thermo-electric cooling apparatus in which the thermal resistances associated with the heat removal of prior art apparatuses is eliminated.

Also, a further object of the present invention is to provide a thermo-electric cooling apparatus in which corrosion associated with the heat removal of prior art apparatuses is eliminated.

An additional object of the present invention is to provide a thermo-electric cooling apparatus in which the apparatus fits into the narrow space permitted on typical printed circuit boards.

There is provided in accordance with the present invention, an IC chip simulation method for simulating the operation of an IC chip, including the steps of selecting a functionally equivalent second IC chip which operates at a slower speed than the speed at which the first IC chip operates (first chip normal speed) at the normal operating temperature of the first IC chip, and then cooling the second IC chip below the normal operating temperature until the second IC chip operates substantially at the first chip normal speed.

There is also provided in accordance with the present invention, an apparatus for thermo-electrically cooling an IC chip, including a Peltier effect device connected to the IC chip and means for directly applying heat-removing fluid to and withdrawing the heat-removing fluid from, the Peltier effect device.

The details of the present invention will be revealed in the following description with reference to the aforementioned drawings.

DESCRIPTION OF THE PREFERRED EMBODIMENT

Figure 1:
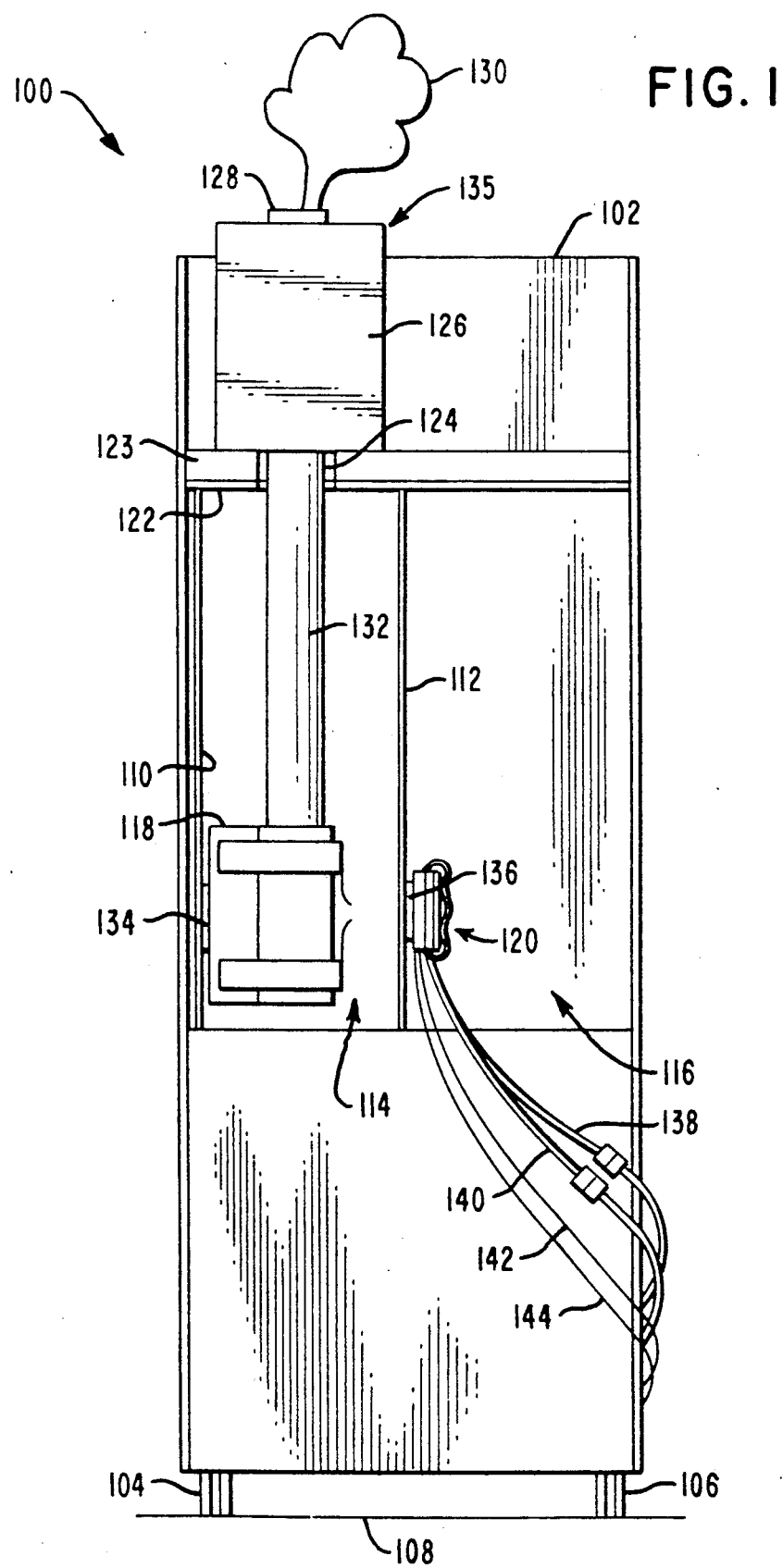
FIG. 1 is a front view of a computer cabinet with its front panel removed to reveal two processor boards whose IC chips are cooled by the two different IC chip cooling apparatuses of the present invention.

The chip cooling arrangement 100 in FIG. 1 has an equipment cabinet 102 with supports 104 and 106 for resting on a base or surface 108. The cabinet 102 contains two printed circuit boards 110 and 112 installed in areas 114 and 116, respectively. The cabinet 102 also contains other system printed circuit boards which are not shown for simplicity. The area 114 contains a cryogenic cooling apparatus 135 for cryogenically cooling an IC chip (not shown in FIG. 1), while the area 116 contains a thermo-electric cooling apparatus 120 for thermo-electrically cooling a separate IC chip (also not shown in FIG. 1).

A shelf 122 with an opening 124 supports a cryogenic fluid reservoir 126 having an opening 128 for expelling gas 130. An insulated connecting structure 132 connects the cryogenic fluid reservoir 126 to the cryogenic chamber 118. The shelf 122 is foam-coated (layer 123) to accommodate thermal shortening of the connecting structure 132 because of reduced temperatures when cryogenic fluid flows through the structure 132 to the chamber 118 (as will be described later). During such shortening of the structure 132, the reservoir 126 bears against the layer 123 as it is drawn closer to the chamber 118, with the layer 123 compressing to accommodate the shortening of the structure 132.

Socket 134 on printed circuit board 110 and socket 136 on printed circuit board 112 receive the pins of the IC chips.

The components in area 114 (save the printed circuit board 110 and the IC socket 134) and the cryogenic fluid reservoir 126 collectively make up a cryogenic cooling apparatus 135, which will be detailed later with respect to FIG. 2.

Connected to the thermo-electric cooling apparatus 120 are a pair of fluid hoses 138 and 140 for transferring cooling or heat removing fluid, and a pair of electric lead wires 142 and 144 for connection to a power supply (not shown). The thermo-electric cooling apparatus 120 will be explained in greater detail infra, with respect to FIGS. 3-5.

Figure 2:
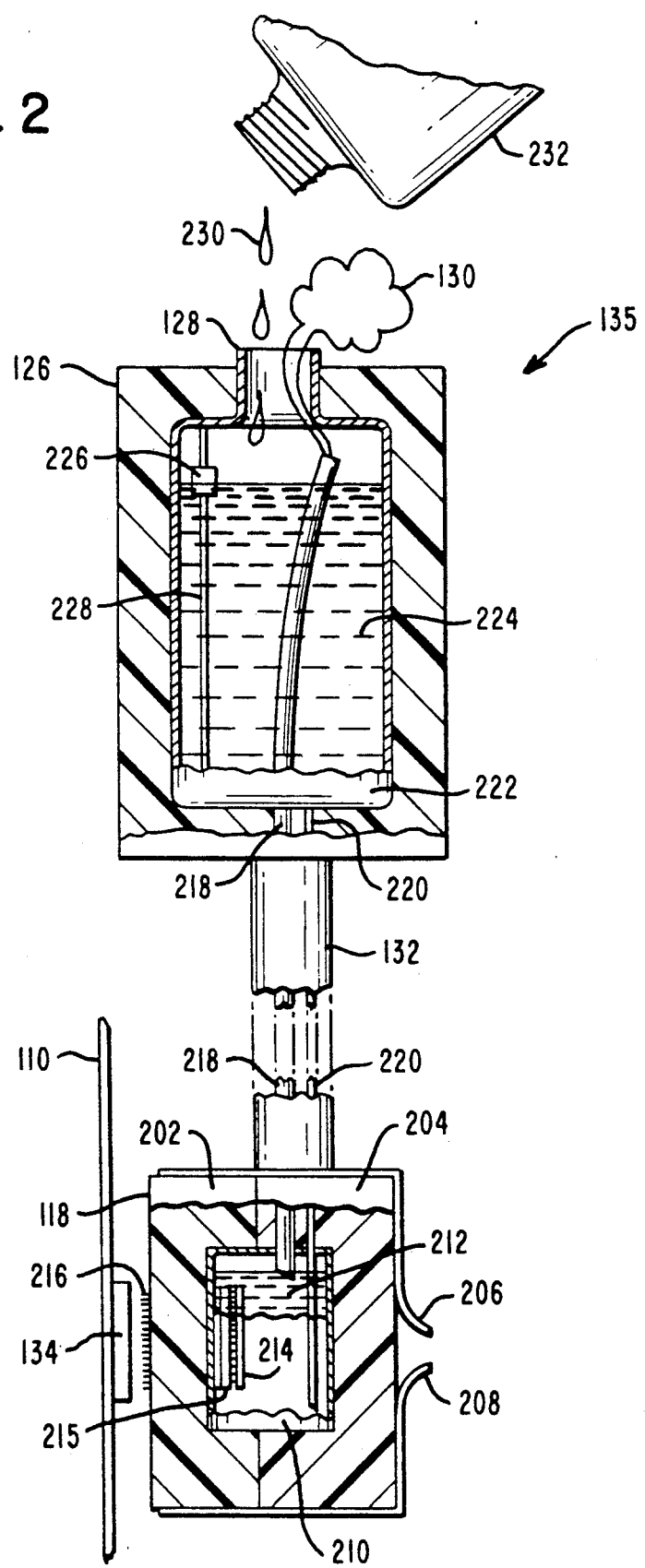
FIG. 2 is a partially sectioned side view of the cryogenic chip cooling apparatus of the present invention.

Turning to FIG. 2, the cryogenic chamber 118 has two insulated enclosure members 202 and 204 which are held together by two straps 206 and 208. The straps are permanently attached to the member 202. The two enclosure members 202 and 204 form a cooling cavity 210 having cryogenic fluid 212 and the IC chip 214 to be cooled. The pins 216 of the socket 215 into which the IC chip is plugged, extend through the walls of the chamber 118 to the socket 134. A flexible gas output tube 218 and a flexible fluid input tube 220 extend from the cooling cavity 210 through the connecting structure 132 into the cryogenic fluid reservoir 126. The cryogenic fluid reservoir 126 contains an insulated reservoir cavity 222 which contains cryogenic fluid such as liquid nitrogen, and a fluid level indicator float 226 slidably mounted on a fluid level indicator rod 228. The fluid level indicator float 226 can be used in a conventional manner to make an electrical circuit (not shown) that tells the user when to add more fluid 230 (e.g., from a bottle 232) at the opening 128 of the reservoir 126.

In operation, cryogenic fluid from the reservoir cavity 222 is transferred via the fluid input tube 220 to the cooling cavity 210. As the IC chip 118 operates and generates heat, the cryogenic fluid removes the heat and cools the chip. As a result of the contact between the surface of the IC chip and the cryogenic fluid, a gas discharge 130 is developed, which is transferred through the gas output tube 218 into the reservoir cavity 222 where it is then expelled through the opening 128. The IC chip is cooled down to a temperature where the slower available IC chip is observed to have an operating speed of the proposed IC chip. In this manner the proposed IC chip design can be simulated and tested.

In the preferred embodiment the cryogenic fluid is liquid nitrogen maintained at approximately 80 degrees Kelvin. At that temperature the IC chips under test have been observed to operate approximately two and one-half times faster than at normal operating temperatures.

Figure 3:
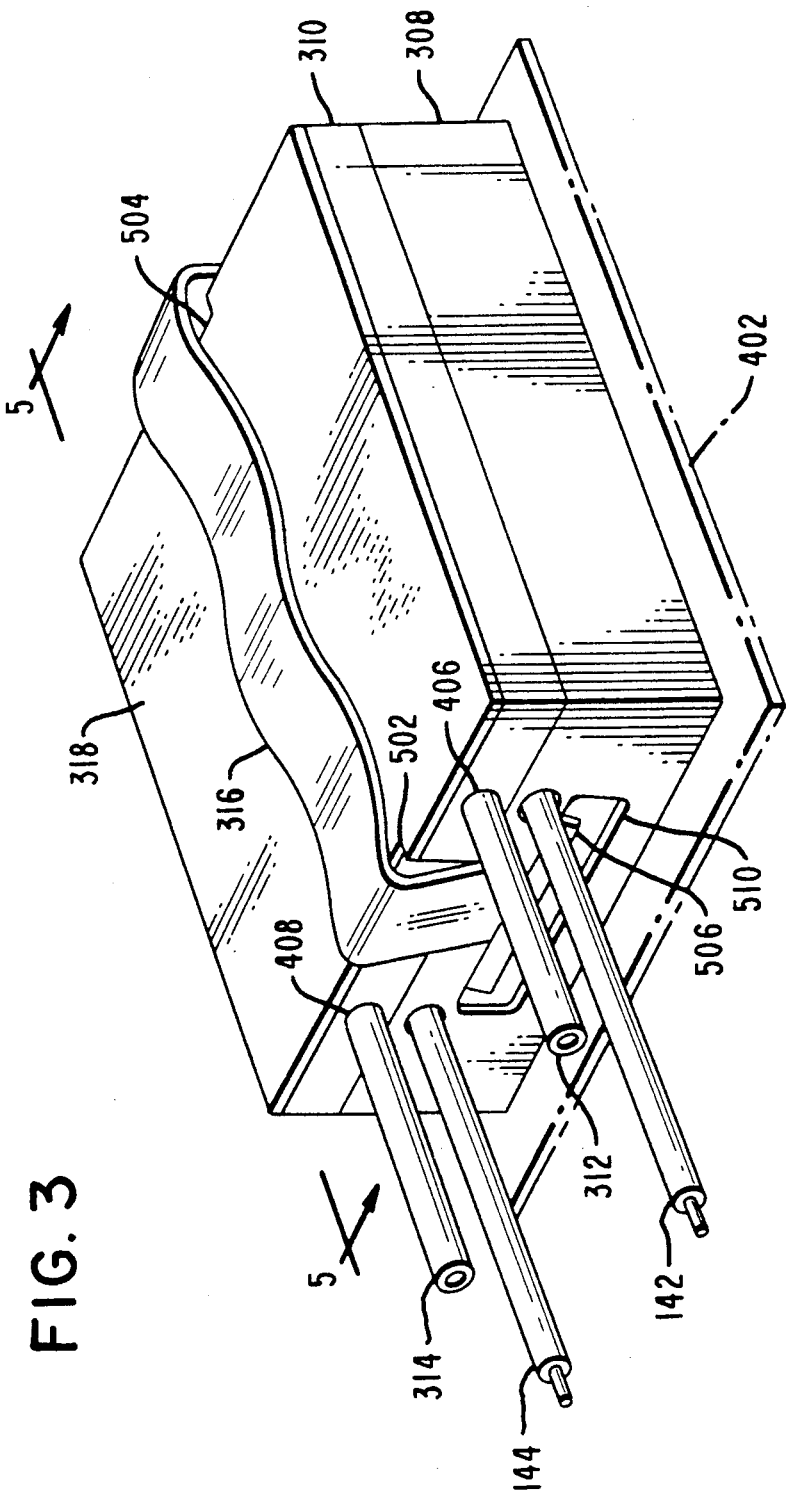
FIG. 3 is an isometric view of the thermo-electric chip cooling apparatus of the present invention.
Figure 4:
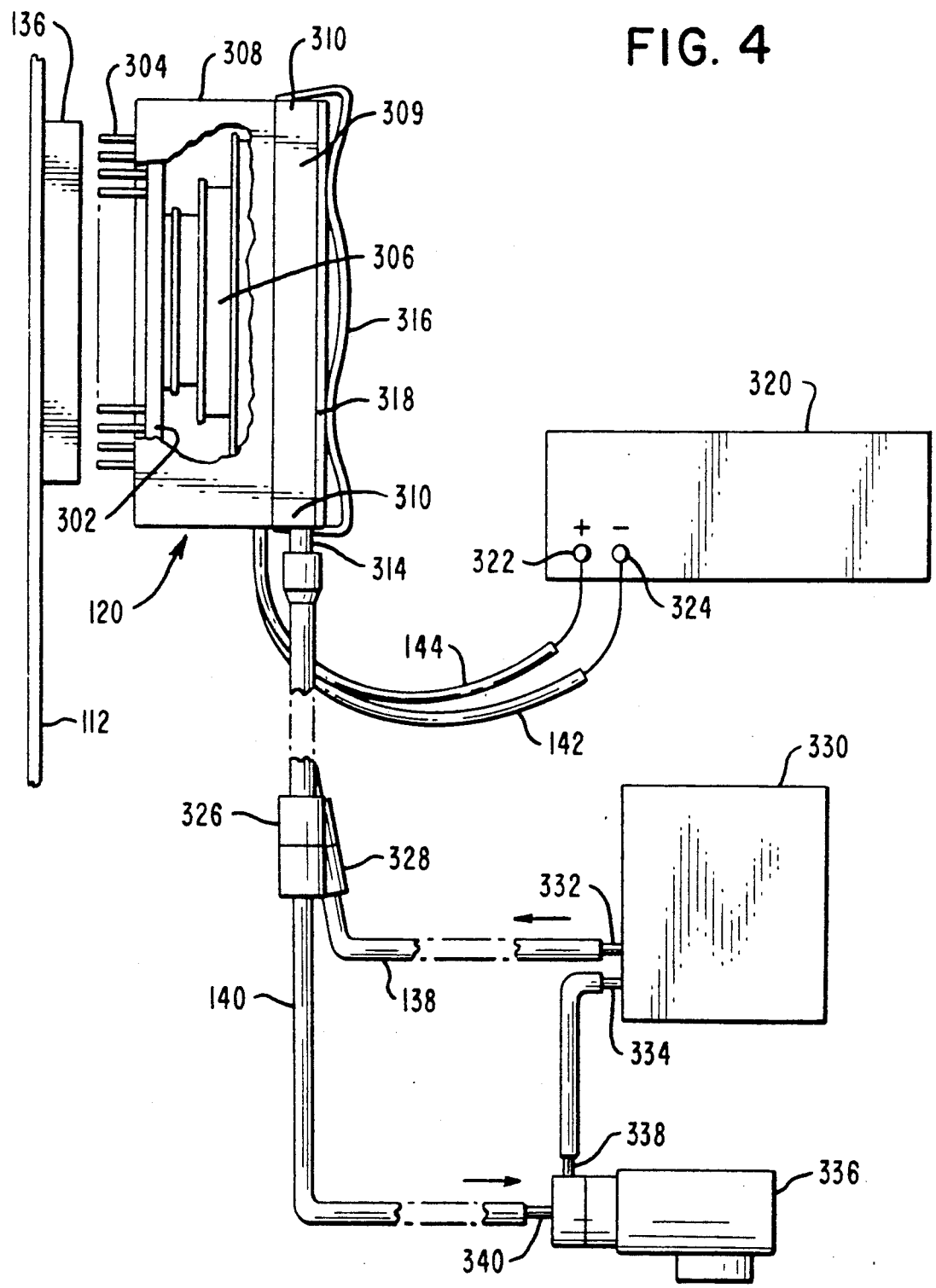
FIG. 4 is a side view with portions removed, of the thermo-electric chip cooling apparatus of the present invention.

The thermo-electric cooling apparatus 120, which may be used where low temperatures (but not as low as cryogenic temperatures) are sought, will now be described in conjunction with FIGS. 3, 4 and 5. As seen best in FIG. 4, an IC chip 302 having pins 304 extending from one side for placement in the socket 136 has a Peltier effect device 306 connected to its opposite side with a thermally conductive compound. Two plastic enclosure members 308 and 310 (serving as a base and a cap, respectively) of the apparatus 120 are held together by a spring clip 316, as will be described infra. Also, a thin metal plate 318 provides the necessary support for the thin plastic surface of the cap 310.

Two fluid pipes 312 and 314 (seen best in FIG. 3) carry the cooling fluid (water in the preferred embodiment) into and out of a cooling fluid region 309 of the apparatus 120. Two quick-disconnect couplers 326 and 328 (FIG. 4) provide for easy joining (and severance) of the pipes 312 and 314 to fluid hoses 138 and 140, respectively. The cooling water is suctioned out of hose 140 through the input 340 of a fluid pump 336, and pumped out through the output 338 to an input 334 of a heat exchanger 330 for removing heat from the cooling fluid. After leaving the heat exchanger 330 via output 332, the cooling fluid is returned to the cooling fluid input hose 138 for circulation in the thermo-electric cooling apparatus 120.

Figure 5:
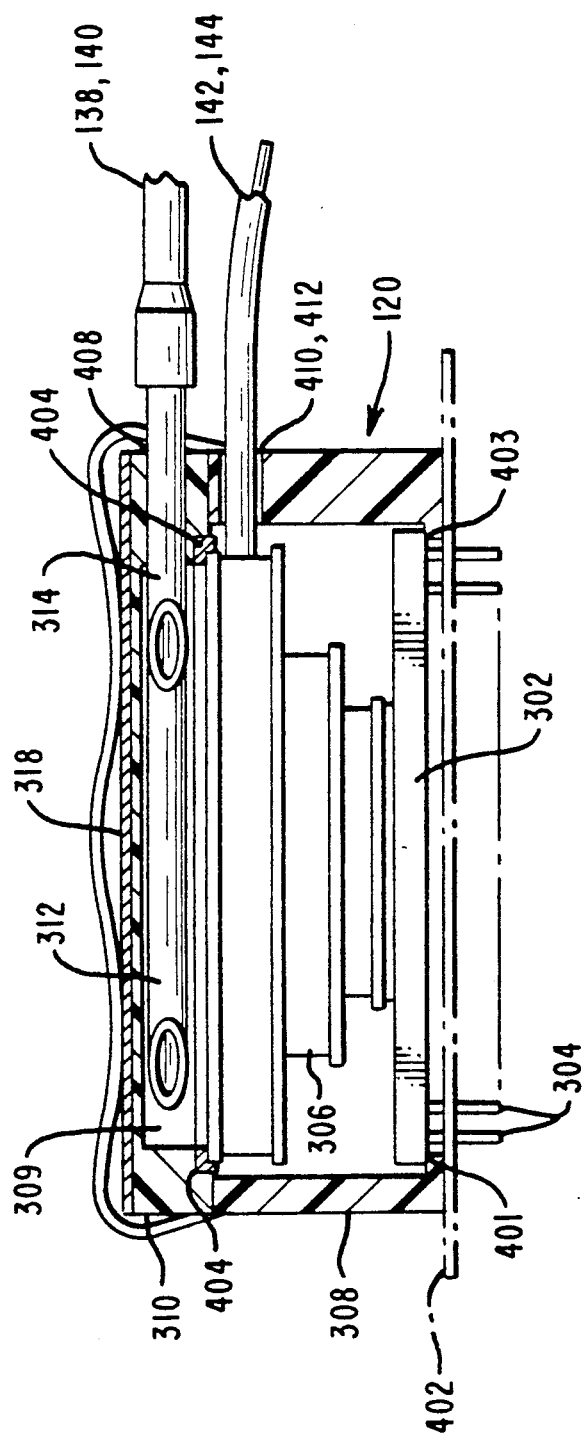
FIG. 5 is a cross-sectional side view taken along the line 5—5 in FIG. 3, of the thermo-electric chip cooling apparatus of the present invention.

Additional details of the thermo-electric cooling apparatus 120 are shown by the cross-sectional view in FIG. 5. There is shown an absorber sheet 402 for collecting and evaporating condensation which may form around the pins 304 or the bottom of the base 308. The absorber sheet 402 is ordinary blotting (ink) paper in the preferred embodiment. It should be noted that the base 308 of the apparatus 120 has ledges 401 and 403 which wedge underneath the IC chip 302 to hold the apparatus 120 into place. A fluid tight gasket seal 404 seals the Peltier effect device 306 and the cap 310 of the apparatus 120 to form the cooling fluid region 309. Two holes 406 and 408 are provided for the two pipes 312 and 314, respectively, and two cutouts 410 and 412 are provided for the electric leads 142 and 144, respectively. The holes 406 and 408 are seen best in FIG. 3.

Returning to FIG. 3, it can be seen that the cap 310 contains alignment slots 502 and 504 for alignment of the spring 316. The spring 316 contains an end tab 506 on one of its ends and a twin end tab on its opposite end (identical to the tab 506, but not shown) which fit into a base recess 510 and an oppositely located twin recess (identical to the recess 510, but not shown), respectively. The tabs have a slight outward curvature which allows the spring 316 to be easily pried away from the recesses with the use of a screwdriver or a fingernail, for example. The combination of the spring 316 with its unique curvature (allowing for pressure on the top surface 318), the slots 502 and 504, the recesses (510 and its twin) and the spring end tabs (506 and its twin), provide for a secure, aligned fit of the apparatus enclosure members 308 and 310.

From FIG. 5 it can be seen that the two fluid pipes 312 and 314 are different in their amount of extension into the cooling fluid region 309 to facilitate even distribution of the cooling fluid.

Use of the cooling apparatus 120 increases the performance of an IC chip by a maximum of approximately 25 per cent at an operating temperature of approximately −20 degrees Fahrenheit, without previously-mentioned drawbacks of the prior art. Additionally, the suction created by the tube and fluid pump arrangement creates a negative pressure which prevents unwanted leakage of the cooling fluid into IC chip or other electronic equipment in the vicinity.

Both of the cooling methods above are only used for testing, and not actual system operation in the preferred embodiments, although the latter is possible. From the above disclosure, it should be noted that the cooling method chosen will depend upon the speed improvement sought, with greater speed increases resulting when the cryogenic method is employed. The thermo-electric cooling method has the advantage of requiring less space than the cryogenic cooling method. It should be noted that the chip cooling arrangement 100 combined the cryogenic and thermo-electric cooling apparatuses for convenience of description, and that the preferred embodiment would employ only one cooling method, depending upon the amount of test IC chip speed enhancement sought.

The IC chips tested with the preferred embodiments were of the CMOS processor type. It should be noted that the present inventive methods are also applicable to CMOS memory chips, for example.

Variations and modifications to the present invention are possible given the above disclosure. However, such variations and modifications are intended to be within the scope of the invention claimed by this letters patent.

We claim:

1. An integrated circuit (IC) chip simulation method for simulating the operation of a first IC chip comprising the steps of:
   selecting a functionally equivalent second IC chip which operates at a slower speed than the speed at which said first IC chip operates (first chip normal speed) at the normal operating temperature of said first IC chip; and
   cooling said second IC chip below said operating temperature until said second IC chip operates substantially at said first chip normal speed.

2. The IC chip simulation method in claim 1 wherein said cooling step comprises the step of:
   coupling said second IC chip to a chamber having cryogenic fluid.

3. The IC chip simulation method in claim 1 wherein said cooling step comprises the steps of:
   coupling said second IC chip to a chamber having cryogenic fluid; and
   removing heat produced from said second IC chip via a by-product of said cryogenic fluid and said heat.

4. The IC chip simulation method in claim 1 wherein said cooling step comprises the step of:
   coupling said second IC chip to a Peltier effect device.

5. The IC chip simulation method in claim 1 wherein said cooling step comprises the steps of:
   coupling said second IC chip to a Peltier effect device; and
   directly applying heat-removing fluid to and withdrawing said heat-removing fluid from, said Peltier effect device.

6. The IC chip simulation method in claim 4 wherein said heat-removing fluid is applied to and withdrawn from said Peltier effect device via a sealed chamber coupled to said Peltier effect device.

7. The IC chip simulation method in claim 6 wherein said heat-removing fluid is water.

8. The IC chip simulation method in claim 6 wherein said heat-removing fluid is inserted and removed from said sealed chamber via tubes of dissimilar extension into said sealed chamber to facilitate even distribution of said heat-removing fluid over a surface of said Peltier effect device.

9. An apparatus for thermo-electrically cooling an integrated circuit (IC) chip comprising:
   A Peltier effect device coupled at a first surface to said IC chip; and
   means for directly applying heat-removing fluid to a second surface of said Peltier effect device, but not applying heat-removing fluid to said IC chip, and withdrawing said heat-removing fluid away from, said Peltier effect device.

10. The apparatus in claim 9 wherein said heat-removing fluid is water.

11. The apparatus in claim 9 wherein said means for directly applying heat-removing fluid comprises a chamber coupled to said Peltier effect device.

12. The apparatus in claim 11 further comprising a seal coupled between the periphery of said Peltier effect device and said chamber to prevent leakage of said heat-removing fluid onto said IC chip.

13. The apparatus in claim 11 wherein said chamber comprises input and output openings for said heat-removing fluid.

14. The apparatus in claim 13 wherein said input and output openings comprise tubes.

15. An apparatus for thermo-electrically cooling an integrated circuit (IC) chip comprising:
   A Peltier effect device coupled at a first surface to said IC chip; and
   means for directly applying heat-removing fluid to at least a second surface of said Peltier effect device, and withdrawing said heat-removing fluid away from, said Peltier effect device, said means for directly applying heat-removing fluid comprising a chamber coupled to said Peltier effect device;
   wherein said chamber comprises input and output openings for said heat-removing fluid having tubes, which tubes unequally extend into said chamber to facilitate even distribution of said heat-removing fluid over a surface of said Peltier effect device.

16. An integrated circuit (IC) chip simulation apparatus for simulating the operation of a first IC chip comprising:
   means for cooling a functionally equivalent second IC chip below the normal operating temperature of said first IC chip, which second IC chip operates at a slower speed than the speed at which said first IC chip operates (first chip normal speed) at said normal operating temperature, until said second IC chip operates substantially at said first chip normal speed.

17. The IC chip simulation apparatus in claim 16 wherein said means for cooling further comprises:
   a chamber having cryogenic fluid for coupling to said second IC chip.

18. The IC chip simulation apparatus in claim 16 wherein said means for cooling further comprises:
   a chamber having cryogenic fluid for coupling to said second IC chip; and
   means for removing heat produced from said second IC chip via a by-product of said cryogenic fluid and said heat.

19. The IC chip simulation apparatus in claim 16 wherein said means for cooling comprises:
   a Peltier effect device for coupling to said second IC chip.

20. The IC chip simulation apparatus in claim 16 wherein said means for cooling comprises:
   a Peltier effect device; and
   means coupled to said Peltier effect device for directly applying heat-removing fluid to and for withdrawing said heat-removing fluid from, said Peltier effect device.

21. The IC chip simulation apparatus in claim 19 wherein said means for directly applying heat-removing fluid is a sealed chamber.

22. The IC chip simulation apparatus in claim 21 wherein said heat-removing fluid is water.

23. The IC chip simulation apparatus in claim 21 further comprising tubes of dissimilar extension into said sealed chamber to facilitate even distribution of said heat-removing fluid over a surface of said Peltier effect device.

24. The apparatus in claim 14 wherein said tubes unequally extend into said chamber to facilitate even distribution of said heat-removing fluid over said second surface of said Peltier effect device.

25. An apparatus for thermo-electrically cooling an integrated circuit (IC) chip comprising:
 A Peltier effect device coupled at a first surface to said IC chip; and
 means for directly applying heat-removing fluid to a second surface of said Peltier effect device, but not applying heat-removing fluid to said IC chip, and withdrawing said heat-removing fluid away from, said Peltier effect device.

26. The apparatus in claim 25 wherein said heat-removing fluid is water.

27. The apparatus in claim 25 wherein said means for directly applying heat-removing fluid comprises a chamber coupled to said Peltier effect device.

28. The apparatus in claim 27 further comprising a seal coupled between the periphery of said Peltier effect device and said chamber to prevent leakage of said heat-removing fluid onto said IC chip.

29. The apparatus in claim 27 wherein said chamber comprises input and output openings for said heat-removing fluid.

30. The apparatus in claim 29 wherein said input and output openings comprise tubes.

31. An apparatus for thermo-electrically cooling an integrated circuit (IC) chip comprising:
 A Peltier effect device coupled at a first surface to said IC chip; and
 means for directly applying heat-removing fluid to a second surface of said Peltier effect device, and withdrawing said heat-removing fluid away from, said Peltier effect device, said means for directly applying heat-removing fluid comprising a chamber coupled to said Peltier effect device;
 wherein said chamber comprises input and output openings for said heat-removing fluid having tubes, which tubes unequally extend into said chamber to facilitate even distribution of said heat-removing fluid over said second surface of said Peltier effect device.

* * * * *